(12) United States Patent
Hasegawa

(10) Patent No.: US 7,264,482 B2
(45) Date of Patent: *Sep. 4, 2007

(54) ANISOTROPIC CONDUCTIVE SHEET

(75) Inventor: Miki Hasegawa, Aichi (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/074,634

(22) Filed: Mar. 9, 2005

(65) Prior Publication Data

US 2005/0201034 A1 Sep. 15, 2005

(30) Foreign Application Priority Data

Mar. 10, 2004 (JP) ............................. 2004-068176

(51) Int. Cl.
H01R 9/09 (2006.01)
(52) U.S. Cl. ..................... 439/66; 439/67; 439/91; 439/591
(58) Field of Classification Search .................. 439/91, 439/66–67, 591
See application file for complete search history.

(56) References Cited

U.S. PATENT DOCUMENTS

| | | | |
|---|---|---|---|
| 3,714,706 A * | 2/1973 | Reizman et al. ............... 29/868 |
| 3,971,610 A * | 7/1976 | Buchoff et al. ................ 439/75 |
| 4,778,950 A * | 10/1988 | Lee et al. .................... 174/260 |
| 5,058,800 A * | 10/1991 | Yoshizawa et al. .... 228/180.21 |
| 5,275,856 A * | 1/1994 | Calhoun et al. ............ 428/41.1 |
| 5,309,324 A * | 5/1994 | Herandez et al. ............ 361/734 |
| 5,531,022 A * | 7/1996 | Beaman et al. ............... 29/850 |
| 5,751,068 A * | 5/1998 | McMahon et al. ........... 257/774 |
| 5,808,874 A * | 9/1998 | Smith ......................... 361/769 |
| 6,270,363 B1 * | 8/2001 | Brofman et al. .............. 439/91 |
| 6,506,059 B2 * | 1/2003 | Bishop et al. ................ 439/66 |
| 6,581,276 B2 * | 6/2003 | Chung ......................... 29/825 |

(Continued)

FOREIGN PATENT DOCUMENTS

CN 1367185 A 9/2002

(Continued)

OTHER PUBLICATIONS

1st Office Action issued by Chinese State IPO (Issued Sep. 11, 2006).

(Continued)

Primary Examiner—Cathy F. Lam
(74) Attorney, Agent, or Firm—Rader, Fishman & Grauer PLLC

(57) ABSTRACT

An anisotropic conductive sheet capable of transmitting high-speed digital signals reliably is provided. The anisotropic conductive sheet has a conductive property in a thickness direction thereof under a predetermined condition, and includes: insulative matrix members having a dielectric constant value of at most 2.28 and a dielectric loss value of at most 0.025; and conductive members having a conductive property in the thickness direction under the predetermined condition in the conductive members capable of flowing electricity between top and bottom surfaces thereof are located in a scattered manner in the matrix members, and the conductive and matrix members are bonded chemically. Especially, the matrix member is made from a resin material having a resin foamed body of a foaming structure, i.e. homogeneous microcell structure. At least one of the conductive members may be of conductive elastomer.

8 Claims, 10 Drawing Sheets

U.S. PATENT DOCUMENTS

| | | |
|---|---|---|
| 6,713,581 B2 | 3/2004 | Asami et al. |
| 6,720,787 B2 * | 4/2004 | Kimura et al. .............. 324/765 |
| 2005/0145974 A1 | 7/2005 | Hasegawa et al. |
| 2005/0224762 A1 | 10/2005 | Hasegawa |
| 2005/0233620 A1 | 10/2005 | Hasegawa |

FOREIGN PATENT DOCUMENTS

| | | |
|---|---|---|
| EP | 1 227 115 A2 | 7/2002 |
| GB | 2 041 828 A * | 9/1980 |
| GB | 2 159 007 A | 11/1985 |
| JP | 60-212980 A | 10/1985 |
| JP | 62-69580 A | 3/1987 |
| JP | 64-42890 A | 2/1989 |
| JP | 5-156129 A | 6/1993 |
| JP | 5-156130 A | 6/1993 |
| JP | 5-156131 A | 6/1993 |
| JP | 5-175649 A | 7/1993 |
| JP | 5-175650 A | 7/1993 |
| JP | 5-291711 A | 11/1993 |
| JP | 6-125154 A | 5/1994 |
| JP | 6-232517 A | 8/1994 |
| JP | 6-283864 A | 10/1994 |
| JP | 7-202439 A | 8/1995 |
| JP | 7-335440 A | 12/1995 |
| JP | 2000-031621 | 1/2000 |
| JP | 2000-298352 | 10/2000 |
| JP | 2001-302736 | 10/2001 |
| JP | 2003-197289 | 7/2003 |
| WO | WO 03/079494 A1 | 9/2003 |
| WO | WO-03/079495 A1 | 9/2003 |
| WO | WO-03/079496 A1 | 9/2003 |

OTHER PUBLICATIONS

Notice of Reasons for Rejection, Ref. No. J03P094, Transmission No. 026751, date Jan. 23, 2007 (3 pages).

* cited by examiner

A-A Cross Section

B-B Cross Section

ANISOTROPIC CONDUCTIVE SHEET

CROSS-REFERENCE TO RELATED APPLICATIONS

This application is based upon and claims the benefits of priority from Japanese Patent Application No. 2004-068176 filed on Mar. 10, 2004, the entire contents of which are incorporated herein by reference.

FIELD OF THE INVENTION

The present invention relates to an anisotropic conductive sheet, and more specifically an anisotropic conductive sheet capable of transmitting radio frequency (RF) signals or high-speed digital signals.

RELATED ART

In recent years, the number of devices handling digital signals, namely potential RF signals substantially, such as computers and cellular telephones have been increasing with the progress of information and communication technology. Therefore, with printed wiring boards used for those devices, there have been coveted the ones which are superior in RF characteristics and low in both dielectric constant and dielectric loss. In general, an epoxy resin laminated sheet with a glass base, a phenolic resin laminated sheet with a paper base, etc. are used as consumer-oriented printed wiring boards. However, the dielectric constant and the dielectric loss of the boards are both relatively high; the former is about 4.8 and the latter is about 0.015. On this account, those boards are not necessarily suitable as components intended for computers, RF receiver-transmitters and the like, which use signals such as RF waves.

In contrast, a printed wiring board made from a glass fabric, fluorine-contained resin material (having a low dielectric constant of 2.6, and a dielectric loss of 0.005) is known as a printed wiring board which offers a low dielectric constant and a low dielectric loss. As a board whose dielectric constant is lowered by changing the structure of the boards have been proposed: a printed board in which a dielectric material of a porous fluorine-contained resin (GORE-TEX(R)) with cavities formed therein is used (e.g. JP-A-64-42890); a printed board in which a thermoplastic resin foam is used for a dielectric layer (e.g. JP-A-62-69580); and a printed board in which a foamed resin layer is used (e.g. JP-A-6-125154), for example.

However, it is not sufficient that the printed wiring board achieves a low dielectric constant and a low dielectric loss by itself. In order to avoid the attenuation of signals in the whole of a device, it is also desired for components other than a board to realize low dielectric constants and low dielectric losses like the board.

SUMMARY OF THE INVENTION

The present invention was made in consideration of the foregoing demand. It is an object of the present invention to provide a component other than a printed wiring board, which is hard to effectively transmit RF band signals owing to its ability of absorption, reflection or the like.

It is not necessarily easy to correctly measure the degree of attenuation of RF signals for each component. However, an anisotropic conductive sheet connecting between an electronic component or and a board or between printed wiring boards Is considered to be a possible source of the attenuation other than a printed wiring board. In order to prevent such attenuation efficiently, it can be expected that reducing the dielectric constant and dielectric loss as described above is effective, while it Is further desired to satisfy the requirements for an anisotropic conductive sheet, i.e. predetermined physical properties including conductivity.

Therefore, a conductive elastomer having characteristics suitable for anisotropic conductive sheets is combined with a material characterized by having relatively low dielectric constant and/or dielectric loss, whereby it is made possible to reliably transmit signals between a board and a component or between boards in addition to preventing the attenuation of RF signals or signals including RF waves. For example, an anisotropic conductive sheet having desired characteristics can be provided by forming an insulative matrix member of the anisotropic conductive sheet from a resin material having a resin foamed body of a foaming structure, i.e. one of homogeneous microcell structures, and arranging at least one conductive member as an element so as to be inserted in the matrix member like a cell penetrating from the top to bottom surface of the anisotropic conductive sheet.

More specifically, the present invention provides the following.

(1) An anisotropic conductive sheet having a conductive property in a thickness direction thereof under a predetermined condition, comprising: insulative matrix members having a dielectric constant value of at most 2.28 and/or a dielectric loss value of at most 0.025; and conductive members (or element members) having a conductive property in the thickness direction under the predetermined condition, wherein the conductive members capable of conducting a flow of electricity between top and bottom surfaces thereof are located among the matrix members In a scattered manner; and the conductive members and matrix insulative members are bonded chemically.

(2) The anisotropic conductive sheet according to (1), wherein the matrix members comprise foamed elastomer.

(3) The anisotropic conductive sheet according to (1) or (2), wherein the conductive members comprise conductive elastomer.

(4) The anisotropic conductive sheet according to any one from (1) to (3), wherein the conductive members and the insulative matrix members are bonded with a silane coupling agent.

(5) A pair of printed wiring boards comprising the anisotropic conductive sheet as defined in any one from (1) to (4) sandwiched between the boards.

The anisotropic conductive sheet can be brought into a conductive state in a direction of the thickness thereof when pressed against a terminal or a contact of a component or a board. At this time, since the conductivity of the sheet is extremely low In a direction of a plane of the sheet (or sheet plane direction), terminals or contacts across the sheet may become conductive only if such terminals or contacts are located in an opposing manner across the sheet. In this way, the sheet can transmit signals between the terminals or contacts. Therefore, the predetermined condition may Include: a compressive force to be applied to the anisotropic conductive sheet; or a compressive strain caused in the anisotropic conductive sheet.

Being insulating (or insulative) may mean a state where the conductive property is extremely low, e.g. the state of at least 1 MΩ·cm at 100V. Each of the matrix members may serve to electrically isolate at least one of constituent elements of the same kind among the anisotropic conductive sheet other than the matrix members from other constituent elements (i.e., the matrix members) among the anisotropic conductive sheet. From another perspective, the matrix members may mean members making principal constituent elements of the anisotropic conductive sheet.

The anisotropic conductive sheet may have a conductive property in a direction of the thickness under the predetermined condition. This is because the sheet has conductive element members penetrating the sheet in the direction of the thickness other than the matrix members. The conductive members may be conductive or non-conductive in its usual condition, but it may have a conductive property under the predetermined condition. Such material may be a conductive elastomer, for example.

That the conductive members are located in a scattered manner in the matrix members may mean that each conductive member is surrounded by the matrix members and electrically insulated from other conductive members. However, this doesn't rule out that conductive members scattered among the matrix members include a conductive member constituted by some conductive members mutually overlapping. The conductive members may be scattered indiscriminately or according to a predetermined rule. The conductive members may be disposed in predetermined locations depending on the arrangement of the terminals or the like to be connected.

"The conductive and matrix members are bonded chemically" may include that the conductive and matrix members are bonded by an adhesive agent, etc. The conductive and matrix members may be bonded at the entire area of their interfaces, or may be partially bonded at the their interfaces. In a case where the members are bonded chemically in this way, it becomes possible to effectively prevent the interfaces from being dislocated owing to compressive strains, etc. In addition, when a compressive force is removed, the sheet can be restored from such strained condition effectively.

The anisotropic conductive sheet allows signal transmission between a board and a component and/or between boards. The component and boards can be mounted on a module such as a board through the anisotropic conductive sheet and used as modules. The anisotropic conductive sheet may be removably sandwiched or may be Incorporated for mounting a component, etc. by welding or adhesive bonding so that it becomes hard to remove.

The present invention allows RF signals to be transmitted to a terminal or contact without attenuating the signals.

Further features of the present invention, its nature, and various advantages will be more apparent from the accompanying drawings and the following description of the preferred embodiment.

DESCRIPTION OF THE PREFERRED EMBODIMENT

Figure 1:
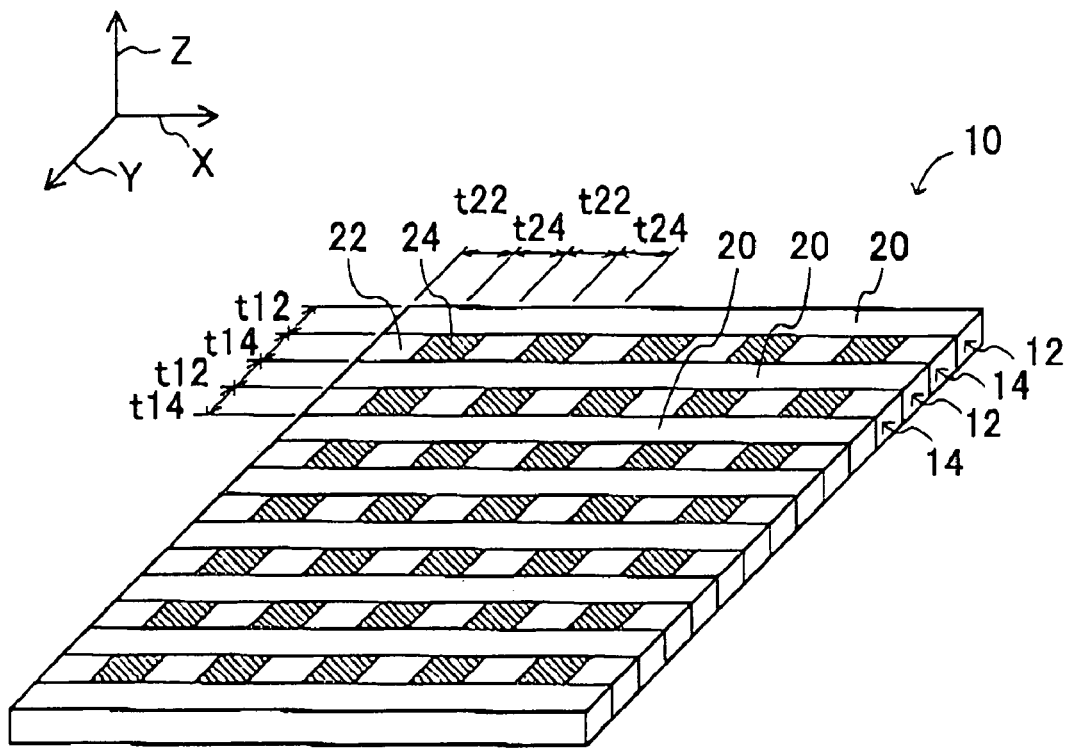
FIG. 1 is a perspective view showing an anisotropic conductive sheet according to an embodiment of the present invention.

The preferred embodiment of the present invention will be described below in reference to the drawings. However, the present invention is not limited to the embodiment, and various modifications and changes in design can be made without departing from the scope of the present invention.

With an anisotropic conductive sheet according to an embodiment of the present invention, a direction which determines a sheet plane of the sheet is defined as X direction; a direction orthogonal to the X direction and contained in the sheet plane is defined as Y direction; and a direction orthogonal to both the X and Y directions is defined as Z direction. The anisotropic conductive sheet may have a predetermined thickness in the Z direction. Therefore, the sheet has a bottom surface substantially in parallel with the sheet plane (i.e. a surface along X-Y plane). The anisotropic conductive sheet includes: striped, belt-shaped members ("striped belts"), each of which extends In the X direction and has a width in the Y direction: and non-conductive belt-shaped members ("non-conductive belts"), each of which is composed of a non-conductive member, extends in the X direction and has a width in the Y direction, in which the striped belts and non-conductive belts are disposed side by side alternately in the Y direction. Further, each striped belt is composed of conductive members ("conductive pieces") having a conductive property and non-conductive members ("non-conductive pieces") having a non-conductive property, in which the conductive and non-conductive members are disposed alternately in the X direction.

The repetition intervals with which the conductive and non-conductive pieces are repeated may be about 80 μm or smaller in the X direction and about 110 μm or smaller in the Y direction. The width of the striped belt may be about 80 μm or smaller. Also, the width of the non-conductive belt may be about 80 μm or smaller.

The conductive pieces may be made from a conductive elastomer, while the non-conductive pieces may be made from a non-conductive foamed resin or non-conductive elastomer. The striped belt may be arranged so as to include the conductive and non-conductive pieces alternately. The non-conductive belt may be made from a non-conductive foamed resin or non-conductive elastomer. The non-conductive foamed resin or non-conductive elastomer has a low dielectric constant and/or a low dielectric loss. More specifically, it is preferable that the non-conductive foamed resin or non-conductive elastomer is lower than the conductive elastomer in a dielectric constant and/or dielectric loss. More preferably, such dielectric constant is less than or equal to 2.28, while the dielectric loss is less than or equal to 0.025. In addition, at least part of the chemical bonds between the members can be established by a coupling agent.

As for the anisotropic conductive sheet, each conductive piece may protrude in the top surface and/or bottom surface of the sheet in comparison with the non-conductive pieces and non-conductive belts, which are located around the conductive piece.

The flexible anisotropic conductive sheet having a predetermined thickness and predetermined top and bottom surfaces on both sides in the direction of the thickness, i.e. front and back sides of the sheet, can be manufactured by a process including: an A and B sheets' stacking step of alternately stacking conductive sheet members (A) ("conductive sheets (A)") each composed of a conductive member and non-conductive sheet members (B) ("non-conductive sheets (B)") each composed of a non-conductive member into an A-and-B-sheets-laminated structure (C) (or A-B sheet-laminate (C)); a first cutting step of cutting the resulting A-and-B-sheets-laminated structure (C) with a predetermined thickness into zebra sheets; a C and D sheets' stacking step of alternately stacking the resulting zebra sheets and non-conductive sheet members (D) ("non-conductive sheets (D)") each composed of a non-conductive member into a C-and-D-sheets-laminated structure (E) (or C-D sheet-laminate (E)), and a second cutting step of cutting the resulting C-and-D-sheets-laminated structure (E) with a predetermined thickness.

Further, the anisotropic conductive sheet can be manufactured by the process, wherein the A and B sheets' stacking step includes: applying a coupling agent to each non-conductive sheet (B) before stacking the conductive sheet (A) on the non-conductive sheet (B): and applying the coupling agent to each conductive sheet (A) before stacking the non-conductive sheet (B) on the conductive sheet (A), wherein the C and D sheets' stacking step includes: applying the coupling agent to each non-conductive sheet (D) before stacking the zebra sheet on the non-conductive sheet (D); and applying the coupling agent to each zebra sheet before stacking the non-conductive sheet (D) on the zebra sheet.

Here, the conductive sheets (A) may comprise or consist of a single kind of sheet members or different kinds of sheet members and so may do the non-conductive sheets (B). For example, the conductive sheets (A) may comprise or consist of sheet members of the same material, but varied in thickness. In addition, while alternately stacking the conductive sheets (A) and non-conductive sheets (B) may mean to stack the sheets (A) and sheets (B) one after the other in arbitrary order, this doesn't rule out putting the third kind of sheets, films, other members, or the like between the conductive sheet (A) and non-conductive sheet (B). Also, each of the steps of stacking sheet members may include placing the coupling agent between the sheets so as to bond the sheets together. The A-and-B-sheets-laminated structure (C) formed by stacking in this way may be heated or subjected to the other treatment for the purpose of enhancing the integrity between the sheets, or further expediting the curing of the sheet members themselves, or for the other purpose.

The A-and-B-sheets-laminated structure (C) may be cut by: a blade of a super steel cutter, a ceramic cutter, or the like; a whetstone such as a fine cutter, sawing by a sawing machine such as saw; or other cutting machines or cutting tools (which may include non-contact type cutting machines such as a laser cutting machine). Moreover, in order to prevent overheating, and to obtain a clean cut area or for other purposes in the cutting process, the laminated structure may be cut using a cutting fluid such as a cutting oil, or it may be cut by a dry process. While a subject to be cut (e.g. work piece) may be cut while being rotated alone or together with a cutting machine or tool, it is needless to say that various conditions for the cutting should be appropriately selected depending on the A-and-B-sheets-laminated structure (C). Now, the phrase, cutting with a predetermined thickness may mean cutting the laminated structure so that sheet members having the predetermined thickness can be produced. The predetermined thickness doesn't means that the thickness of each resulting sheet member is necessarily uniform anywhere in the member. The thickness of the sheet member may be changed depending on a place in the member.

In regard to the Zebra and D sheets' stacking step of alternately stacking the zebra sheets and the non-conductive sheets (D) into a Zebra-and-D-sheets-laminated structure (E) (or C-D sheet-laminate (E))), the same thing can be also said as what has been described above concerning the A and B sheets' stacking step to obtain an A-and-B-sheets-laminated structure (C) from the conductive sheets (A) and the non-conductive sheets (B). Also, in regard to the second cutting step of cutting the Zebra-and-D-sheets-laminated structure (E) (or C-D sheet-laminate (E)) with a predetermined thickness, the same thing can be said as what has been described above about the first cutting step of cutting the A-and-B-sheets-laminated structure (C) (or A-B sheet-laminate (C)).

The flexible anisotropic conductive sheet of the present invention having a predetermined thickness and predetermined top and bottom surfaces on both sides in the direction of the thickness may be characterized by including a broad belt-shaped member (hereinafter referred to as broad belt) whose height substantially corresponds to the thickness of the anisotropic conductive sheet. The broad belt includes: striped, belt-shaped members ("striped belts"), each having a predetermined height substantially in agreement with the predetermined thickness of the anisotropic conductive sheet, a predetermined width, and a length longer than its height and width; and non-conductive belt-shaped members ("non-conductive belts") having a non-conductive property, each having a predetermined height substantially in agreement with the predetermined thickness of the anisotropic conductive sheet, a predetermined width, and a length longer than its height and width, wherein the striped belts and the non-conductive belts are arranged side by side in the direction of the width of broad belt so that they coincide with each other in height and length. In addition, the striped belts has conductive members ("conductive pieces") having a conductive property and non-conductive members ("non-conductive pieces") having a non-conductive property, which are disposed alternately in the direction of the length of the striped belts.

Having a predetermined thickness and predetermined top and bottom surfaces on both sides in the direction of the thickness may be a feature that a usual sheet has. The anisotropic conductive sheet has a predetermined thickness, and it may have top and bottom surfaces determined by dimensions larger than the thickness in the front and the bottom or on the upside and the downside of the sheet in the direction of the thickness. Being flexible may mean that the sheet can be bent. A striped belt may take on a long and narrow form in which conductive pieces and non-conductive pieces are coupled alternately. The height (or thickness) of the striped belt may be substantially the same as height (or thickness) of the conductive pieces and non-conductive pieces. The striped belt may have a fixed height (or thickness). In addition, the width of the striped belt may be substantially the same as the width of the conductive pieces and non-conductive pieces, and may be fixed. A non-conductive belt may have substantially the same height (or thickness) and length as those of the striped belt. Therefore, a broad belt may have a width larger than or substantially equal to the sum of the widths of the striped belt and the non-conductive belt because the striped belt and the non-conductive belt are bonded side by side in the direction of the width so that they coincide with each other in height and length.

Having a conductive property may mean to have a sufficiently high conductivity or to have a sufficiently low electric resistance. Further, for the whole anisotropic conductive sheet, the phrase may means to have a conductive property such that an anisotropic conductive sheet having such configuration can take on a sufficient conductive property in its conductive direction. The resistance between terminals to be connected usually is preferably 100 Ω or smaller (more preferably 10 Ω or smaller, and much more preferably 1 Ω or smaller).

Having a non-conductive property may mean to have a sufficiently low conductivity or to have a sufficiently high impedance or electric resistance. Further, for the whole anisotropic conductive sheet, the phrase may means to have a non-conductive property such that an anisotropic conductive sheet having such configuration can take on a sufficient non-conductive property in its non-conductive direction. The resistance is preferably 10 kΩ or larger (more preferably 100 kΩ or larger, and much more preferably 1 MΩ or larger).

The striped, belt-shaped member ("striped belt") disposed alternately may be a long and narrow member having conductive and non-conductive pieces disposed alternately. The long and narrow member doesn't necessarily seem to be actually in a stripe pattern. What is intended here is that the long and narrow member may seem to have a stripe pattern if the conductive and non-conductive pieces are different in color. However, the alternate placement like this doesn't have to be necessarily applied to the entire striped belt. It is sufficient that the striped belt has a part in such condition, i.e. where the conductive and non-conductive pieces are alternately disposed.

The repetition interval corresponds to a distance derived from the arithmetic operation: the sum of the lengths of two adjacent conductive and non-conductive pieces (in the longitudinal direction of the belt-shaped member) is divided by two. When different distances are derived from the arithmetic operation, the repetition Interval may mean the shortest one. In general, when it is assumed that a substantially straight line segment is drawn on the sheet, the line segment runs across a conductive member (I)/non-conductive member (II)/conductive member (III)/non-conductive member (IV) or a non-conductive member (I)/conductive member (II)/non-conductive member (III)/conductive member (IV) and as such, the repetition interval may be considered to correspond to the result of the arithmetic operation: the sum of the distances of the routes along which the line segment runs across the (II) and (III) is divided by two. The Inter-terminal distance to be applied means a distance between terminals in the non-conductive direction of the anisotropic conductive sheet when the sheet has the terminals to be connected to a circuit board and/or an electronic component in the conductive direction of the sheet, for example. When such distance takes on different values, the Inter-terminal distance to be applied may be the smallest one.

In the present invention, the repetition intervals, with which the conductive and non-conductive pieces are repeated in the striped belt, may be about 80 µm or smaller in the X direction and about 110 µm or smaller in the Y direction. Further, the width of the striped belt may be about 80 µm or smaller. The width of the non-conductive belt may be about 80 µm or smaller. The stripe pattern doesn't necessarily look like striped actually as described above, and it only represents a condition where the conductive and non-conductive pieces are disposed alternately. Here, the repetition intervals are as described above. More specifically, the repetition intervals in the X and Y directions may be about 80 µm or smaller in the X direction and about 110 µm or smaller in the Y direction. The widths of the two kinds of pieces may be about 80 µm or smaller, and more preferably about 50 µm or smaller respectively.

The present invention may be characterized in the following. The first is that the conductive pieces and non-conductive pieces, which constitute the striped belt are made from conductive elastomer and non-conductive elastomer respectively. The second is that the members are chemically bonded with each other (chemical bond), and at least part of such chemical bonds can be established by a coupling agent. In the present invention, chemical bonds may be established between the members and therefore the anisotropic conductive sheet may be handled as a single structure. In general, unvulcanized elastomer (i.e. elastomer which has not been subjected to the cross-linking treatment such as heating), can be chemically bonded with unvulcanized elastomer and vulcanized elastomer at the molecular level as they are crosslinked by vulcanization (i.e. a cross-linking treatment such as heating). Further, even with other combinations as well as the combinations described above, it is possible to establish molecular level chemical bonds at their interfaces by a coupling agent, provided that the process by the coupling agent may include a surface treatment by a primer, etc. The feature of the chemical bond is a strong bonding force. For example, when in an anisotropic conductive sheet, a metal thin wire is inserted in elastomer thereof, the bond through the bonding force is stronger than that between the metal thin wire and elastomer. The chemical bond can be grasped as a word comparable with the physical bond and the mechanical bond.

The conductive elastomer means elastomer having a conductive property, and it may be typically elastomer in which an electroconductive material is mixed so that its specific volume resistance is lowered (e.g. 1 Ω·cm or smaller). Specifically, what can be used as such elastomer is: caoutchouc; polyisoprene rubber; butadiene copolymers and conjugated diene-based rubbers of butadiene-styrene, butadiene-acrylonitrile, butadiene-isobutylene, etc., and those subjected to hydrogenation; styrene-butadiene-diene block polymer rubber; block polymer rubbers of styrene-isoprene block polymer, etc. and those subjected to hydrogenation; chloroprene polymer; vinyl chloride-vinyl acetate copolymer; urethane rubber; polyester-based rubber; epichlorohydrin rubber; ethylene-propylene copolymer rubber; ethylene-propylene-diene copolymer rubber; soft liquid epoxy rubber; silicone rubber; fluororubber; or the like. Of these materials, what is preferably used is silicone rubber superior in heat resistance, brittle resistance at low temperature, chemical resistance, weather resistance, electrical insulative property, and safety. Conductive elastomer can be formed by blending the following conductive substance into such elastomer: a powdered metal (for which a substitutable form is a flake, a fragment, a foil, or the like) of gold, silver, copper, nickel, tungsten, platinum, palladium, other pure metals, SUS, phosphor bronze, beryllium copper, or the like; or nonmetallic powder (for which a substitutable form is a flake, a fragment, a foil, or the like) of carbon, or the like. Incidentally, the carbon may include carbon nanotube, fullerene, etc.

The coupling agent for bonding the conductive elastomer and non-conductive elastomer is a binder capable of bonding these members, and it may include a commercially available, usual adhesive agent. Specifically, the coupling agent may be any of silane-based, aluminum-based, and titanate-based coupling agents, and those of them, a silane coupling agent is used well.

The flexible anisotropic conductive sheet of the present invention may be characterized in each of the conductive members protrudes in comparison with the non-conductive matrix located around the conductive member. To protrude may represent any one of or all of the conditions: where the conductive member is thicker than a portion where the non-conductive matrix is located in the thickness of the anisotropic conductive sheet; where the level of the upper surface of the non-conductive matrix is lower than the level of the upper surface of the conductive member when the anisotropic conductive sheet is placed horizontally; and/or where the level of the lower surface of the non-conductive matrix is higher than the level of the lower surface of the conductive member when the anisotropic conductive sheet is placed horizontally. Arranging an anisotropic conductive sheet like this can make electrical contacts with terminals of an electronic component and a board more reliable. This is because when the terminals are brought near to the sheet, the terminals first touch the conductive members and as such, the force to press the terminals against the sheet enables an appropriate contact pressure to be ensured.

EXAMPLES

The embodiment of the present invention will be described below in reference to the drawings. However, in the description on the embodiment, specific materials, numerical values, etc. are cited merely as preferred examples according to the present invention and as such, the present invention is not limited to the embodiment.

FIG. 1 shows an anisotropic conductive sheet 10 as an embodiment of the present invention. The anisotropic conductive sheet 10 of the embodiment is a rectangular sheet member and is configured by alternately disposing: belt-shaped members 12 each composed of a non-conductive member; and striped, belt-shaped members 14 each having conductive members and non-conductive member alternately disposed. The adjacent belt-shaped member 12 composed of the non-conductive member and striped, belt-shaped member 14 are bonded by a coupling agent. For the anisotropic conductive sheet of the embodiment, a conductive silicone rubber manufactured by Shin-Etsu Polymer Co., Ltd. is used as the conductive elastomer; and a silane coupling agent manufactured by Shin-Etsu Polymer Co., Ltd. is used as the coupling agent. The non-conductive elastomer has the following physical properties.

Dielectric Constant ($\epsilon$, 1 Gz)=2.28,
Dielectric Dissipation Factor (Tan $\delta$)=0.025,
Volume Resistivity (Ω·cm)=1.00E+13, and
Cell Size (μm)=1-2.

Figure 2:
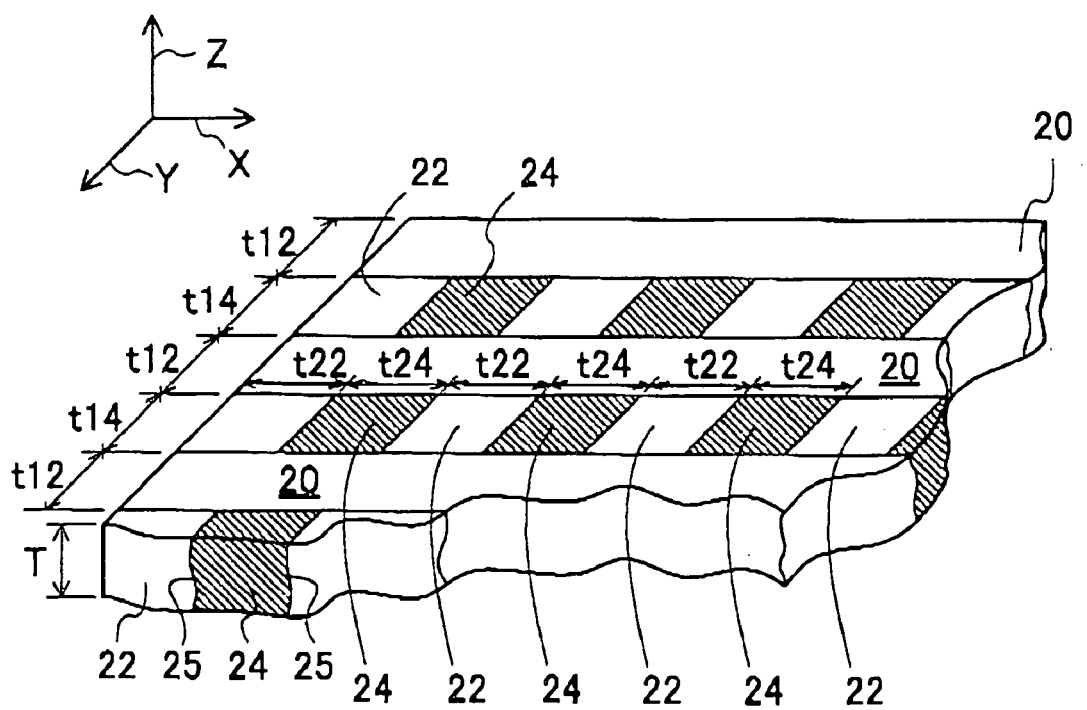
FIG. 2 is an enlarged, fragmentary view, in which an upper left portion of the anisotropic conductive sheet shown in FIG. 1 is enlarged according to the embodiment of the present invention.

FIG. 2 is an enlarged, fragmentary view showing an enlarged upper left corner portion of the anisotropic conductive sheet shown in FIG. 1, in which the belt-shaped members 12, 14 are illustrated in detail further. In FIG. 2, the belt-shaped members 12, each composed of a non-conductive member shown in FIG. 1, correspond to belt-shaped members 20, and the striped, belt-shaped members 14 ("striped belt") in FIG. 1 correspond to striped belts each including non-conductive members 22 and conductive members 24. In other words, the anisotropic conductive sheet takes on a structure in which the striped belts each including non-conductive members 22 and conductive members 24 and non-conductive belt-shaped members 20 ("non-conductive belts") are arranged as follows: one striped belt is disposed next to one non-conductive belt, next to which is disposed another non-conductive belt 20, further next to which is disposed another striped belt. The two kinds of belt-shaped members have substantially the same thickness (T) in this embodiment. As described above, adjacent belt-shaped members are bonded with each other by a coupling agent. Also, of the conductive and non-conductive members which constitute the striped belt 14, adjacent members are bonded with each other by the coupling agent. Thus, one sheet as shown in FIG. 1 is configured. Here, the coupling agent for the bonding is non-conductive and as such, the non-conductive property in a direction in parallel with the sheet plane is maintained.

The width of each non-conductive belt 20 is $t_{12}$, and the width of each striped belt 14 is $t_{14}$. While these widths are all the same in this embodiment, some of them may be the same value, or all of them may be different values. The widths can be adjusted easily in a method of manufacturing an anisotropic conductive sheet according to the embodiment, which is to be described later. The striped belt 14 includes non-conductive members 22 with a length of $t_{22}$ and conductive members 24 with a length of $t_{24}$. While the lengths of the members are all the same in this embodiment, some of them may be the same value, or all of them may be different values. The lengths can be adjusted easily in the method of manufacturing an anisotropic conductive sheet according to the embodiment, which is to be described later.

In this embodiment, the length of the conductive members ("conductive pieces") of each striped belt is about 50 μm and the length of the non-conductive members ("non-conductive pieces ") is about 30 µm, the width of the striped belts is about 50 µm, and the width of the non-conductive belts is about 50 µm. However, it is needless to say that those may be made longer (or larger) or shorter (or smaller) in another embodiment.

In the case of the embodiment, the repetition interval corresponds to a numerical value derived from the arithmetic operation: the sum of the lengths of two adjacent different kinds of elastomer is divided by two, i.e. $(t_{22}+t_{24})/2$. For the entire anisotropic conductive sheet, the average of values derived in this way may be used to feature the anisotropic conductive sheet. However, the minimum value may be used instead. Otherwise, a combination of the minimum, average values, etc. may be used. When the average value is used, a fine pitch performance for the entire sheet is to be represented. When the minimum value is used, it can be considered that a minimum Inter-terminal distance which can be guaranteed is to be determined. In a case where the conductive elastomer are disposed relatively uniformly, the number of times that the conductive elastomer of a predetermined length appears per unit length in the striped, belt-shaped member, or a cumulative length of the conductive elastomer per unit length may be used. In this embodiment, the repetition interval is about 40 µm even when the average or minimum value is used, and the cumulative length of the conductive elastomer per unit length is about 0.6 mm/mm.

While the size of the anisotropic conductive sheet of this embodiment can be clearly specified by adding the widths or lengths, the sheet is not restricted in thickness T as well as width and length. (The thickness of the anisotropic conductive sheet of the embodiment is about 1 mm.) However, when the anisotropic conductive sheet is used to connect between terminals of a circuit board and an electronic component, it is desirable that the sheet is sized so as to match their dimensions. In a case like this, an anisotropic conductive sheet usually measuring 0.5 to 3.0 cm by 0.5 to 3.0 cm has a thickness of 0.5 to 2.0 mm.

Figure 3:
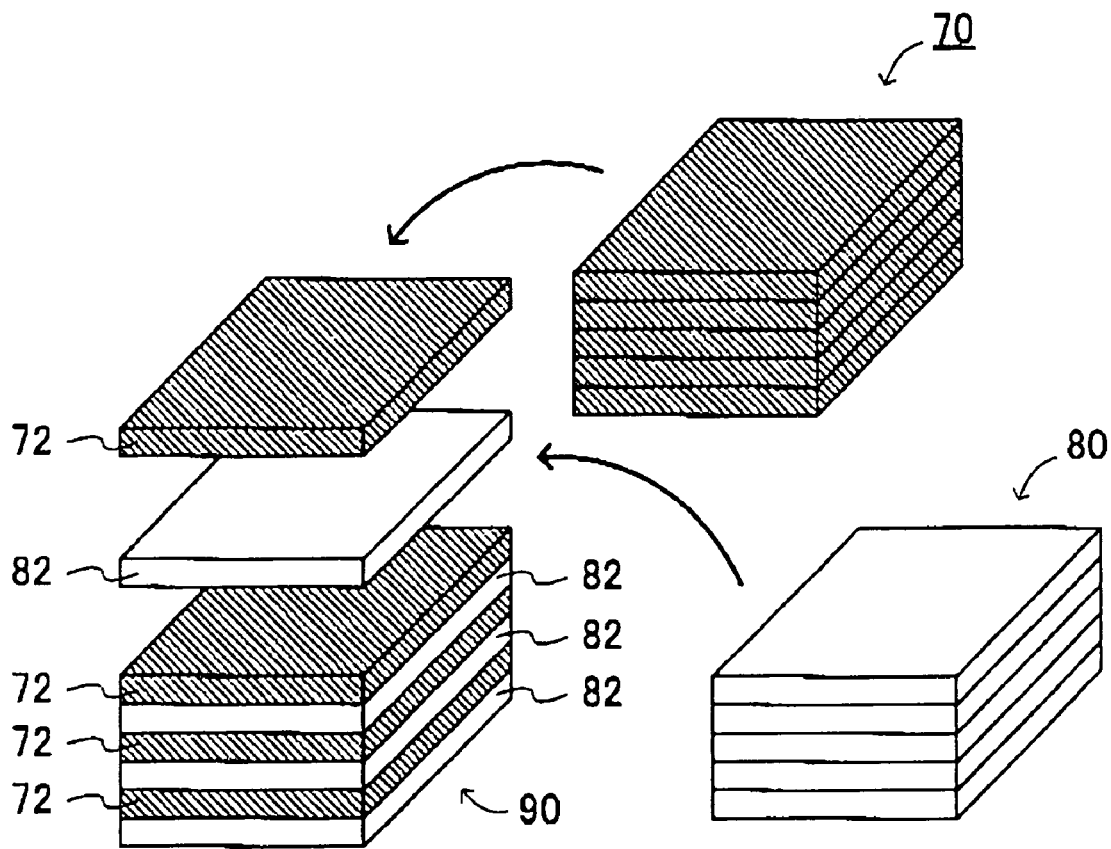
FIG. 3 illustrates a step of stacking conductive and non-conductive sheets in association with a method of manufacturing an anisotropic conductive sheet according to the embodiment of the present invention.

Now, a method of manufacturing an anisotropic conductive sheet according to the embodiment will be described in reference to FIGS. 3 to 6. FIG. 3 shows the way that an A-and-B-sheets-laminated structure (C) (or A-B sheet laminate (C)) is formed by alternately stacking already-prepared conductive sheet members (A) 70 ("conductive sheets (A)") and non-conductive sheet members (B) 80 ("non-conductive sheets (B)"). On the A-and-B-sheets-laminated structure (C) 90 (or A-B sheet laminate (C) 90) in the course of stacking, a non-conductive sheet 82 is further stacked and then the conductive sheet 72 is stacked thereon. A coupling agent is put between the sheet members thereby to bond between the sheet members. In the undermost position of the A-and-B-sheets-laminated structure 90 in the course of stacking, the non-conductive sheet 83 is disposed. The thickness of the sheet member may be regarded as corresponding to $t_{22}$ shown in FIGS. 1 and 2. The thickness of the conductive sheet 72 located thereon may be regarded as corresponding to $t_{24}$ shown in FIGS. 1 and 2. Therefore, the lengths of the non-conductive and conductive pieces in the striped belts 14 shown in FIGS. 1 and 2 can be varied freely by changing the thickness of the sheet members 72 and 82. Likewise, the lengths $t_{22}$ and $t_{24}$ of the two kinds of members of the striped belt located between the non-conductive belts 20 correspond to the thicknesses of the corresponding non-conductive and conductive sheet members respectively. Usually, the thicknesses of the sheet members are about 80 µm or smaller, and more preferably about 50 µm or smaller for fine pitch. In this embodiment, the thicknesses of the non-conductive and conductive sheet members are adjusted so that the length of the non-conductive members is about 30 µm, and the length of the conductive members is about 50 µm.

Incidentally, alternately stacking the conductive and non-conductive sheet members may include to pile up two or more conductive sheet members and then stack one or more non-conductive sheet member thereon. Likewise, alternately stacking the conductive and non-conductive sheet members may include to pile up two or more non-conductive sheet members and then stack one or more conductive sheet member thereon.

Figure 4:
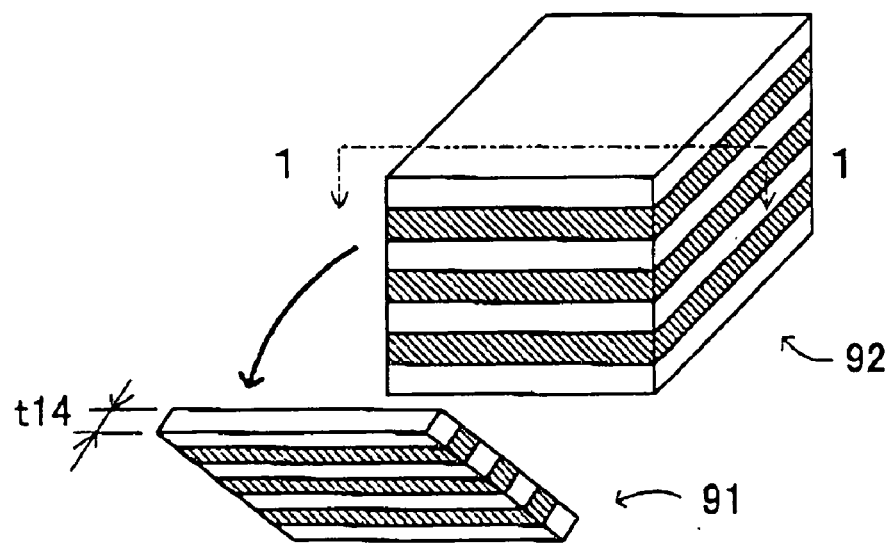
FIG. 4 illustrates a step of cutting a laminate of conductive and non-conductive sheets stacked as shown in FIG. 3, in association with the method of manufacturing an anisotropic conductive sheet according to the embodiment of the present invention.

FIG. 4 shows the first cutting step of cutting an A-and-B-sheets-laminated structure (C) 92 produced by the A and B sheets' stacking step. The A-and-B-sheets-laminated structure 92 is cut along a cutting-plane line 1-1 so that the thickness of the resulting zebra sheet members 91 ("zebra sheets") becomes a desired $t_{14}$. The thickness $t_{14}$ corresponds to $t_{14}$ shown in FIGS. 1 and 2. Thus, the striped belts 14 in FIGS. 1 and 2 can be adjusted freely in their widths. All of the striped belts 14 may have the same width or they have different widths. The thicknesses of the zebra sheets are typically about 80 µm or smaller, and more preferably about 50 µm or smaller. In this embodiment, the thicknesses are about 50 µm.

Figure 5:
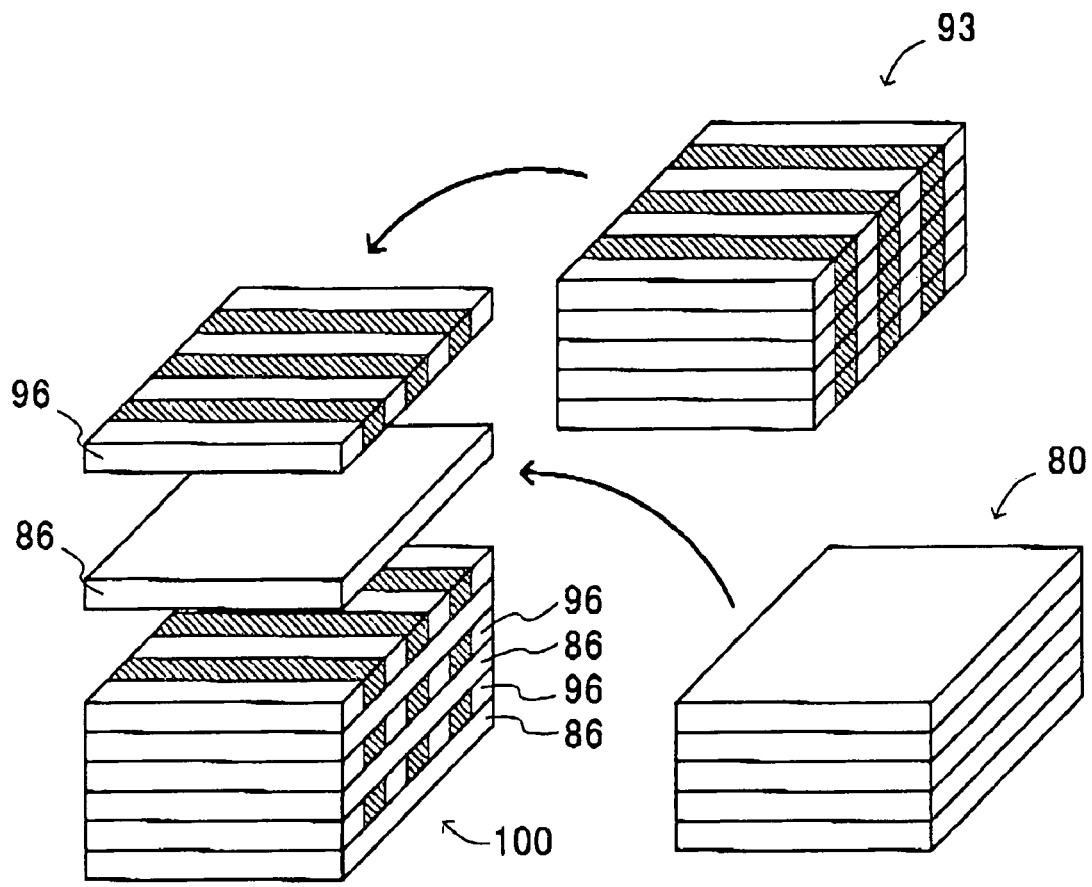
FIG. 5 illustrates a step of stacking sheets obtained by the cutting step illustrated in FIG. 4 and non-conductive sheets in association with the method of manufacturing an anisotropic conductive sheet according to the embodiment of the present invention.

FIG. 5 shows the way that a Zebra-and-D-sheets-laminated structure (E) (or C-D sheet-laminate (E)) is formed by alternately stacking zebra sheets 91 produced by the first cutting step and non-conductive sheet members (D) 80 ("non-conductive sheet (D)"). On the C-and-D-sheets-laminated structure (E) 100 (or C-D sheet-laminate (E) 100) in the course of stacking, a non-conductive sheet 86 is further stacked and then the zebra sheet 96 is stacked thereon. The coupling agent is put between the sheet members thereby to bond between the sheet members. In the undermost position of the C-and-D-sheets-laminated structure 100 in the course of stacking, the non-conductive sheet 86 is disposed. The thickness of the sheet member may be regarded as corresponding to $t_{12}$, i.e. the width of the non-conductive belt 12 shown in FIGS. 1 and 2. Therefore, the widths of the two kinds of belt-shaped members 12 and 14 shown in FIGS. 1 and 2 can be varied freely by changing the thicknesses of the sheet members 86, 96. Usually, the widths of the sheet members are about 80 µm or smaller, and more preferably about 50 µm or smaller for fine pitch. In this embodiment, these widths are adjusted so that the width of the non-conductive belts 12 is about 30 µm, and the width of the striped belts 14 is about 50 µm.

Figure 6:
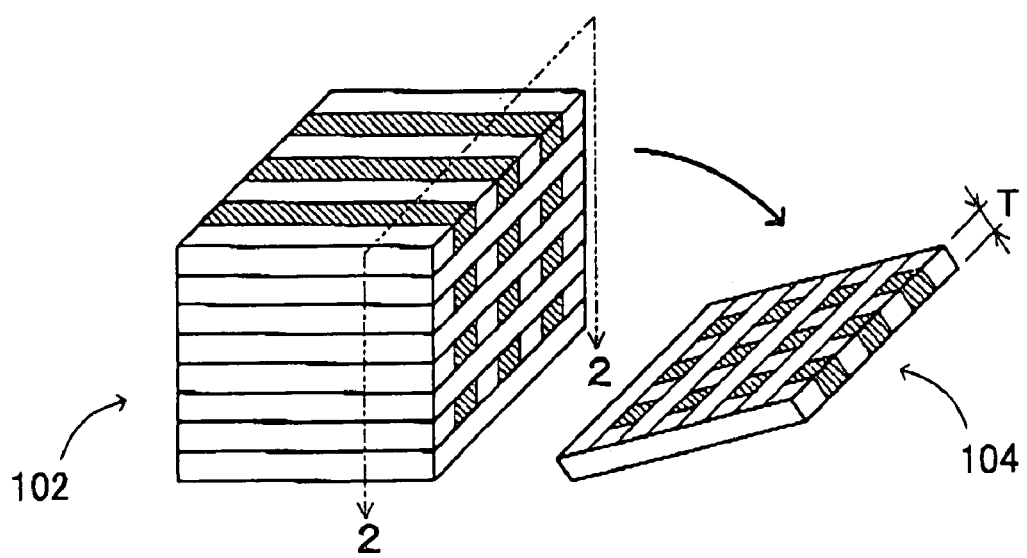
FIG. 6 illustrates a step of cutting a laminated structure obtained by the stacking step illustrated in FIG. 5 in association with the method of manufacturing an anisotropic conductive sheet according to the embodiment of the present invention.

FIG. 6 shows the second cutting step of cutting a Zebra-and-D-sheets-laminated structure (E) 102 (or C-D sheet-laminate (E) 102) produced by the C and D sheets' stacking step. The laminated structure 102 is cut along a cutting-plane line 2-2 so that the thickness of the resulting anisotropic conductive sheets 104 becomes a desired T. Thus, it becomes possible to facilitate the fabrication of thin and thick anisotropic conductive sheets, which is usually considered to be difficult. While the thickness of the anisotropic conductive sheets is usually about 1 mm, the thickness may be about 100 µm or smaller when the sheet is made thinner. The thickness may be made about 50 µm or smaller when particularly desired so. Also, the thickness may be made a few mm. In this embodiment, the thickness is about 1 mm.

Figure 7:
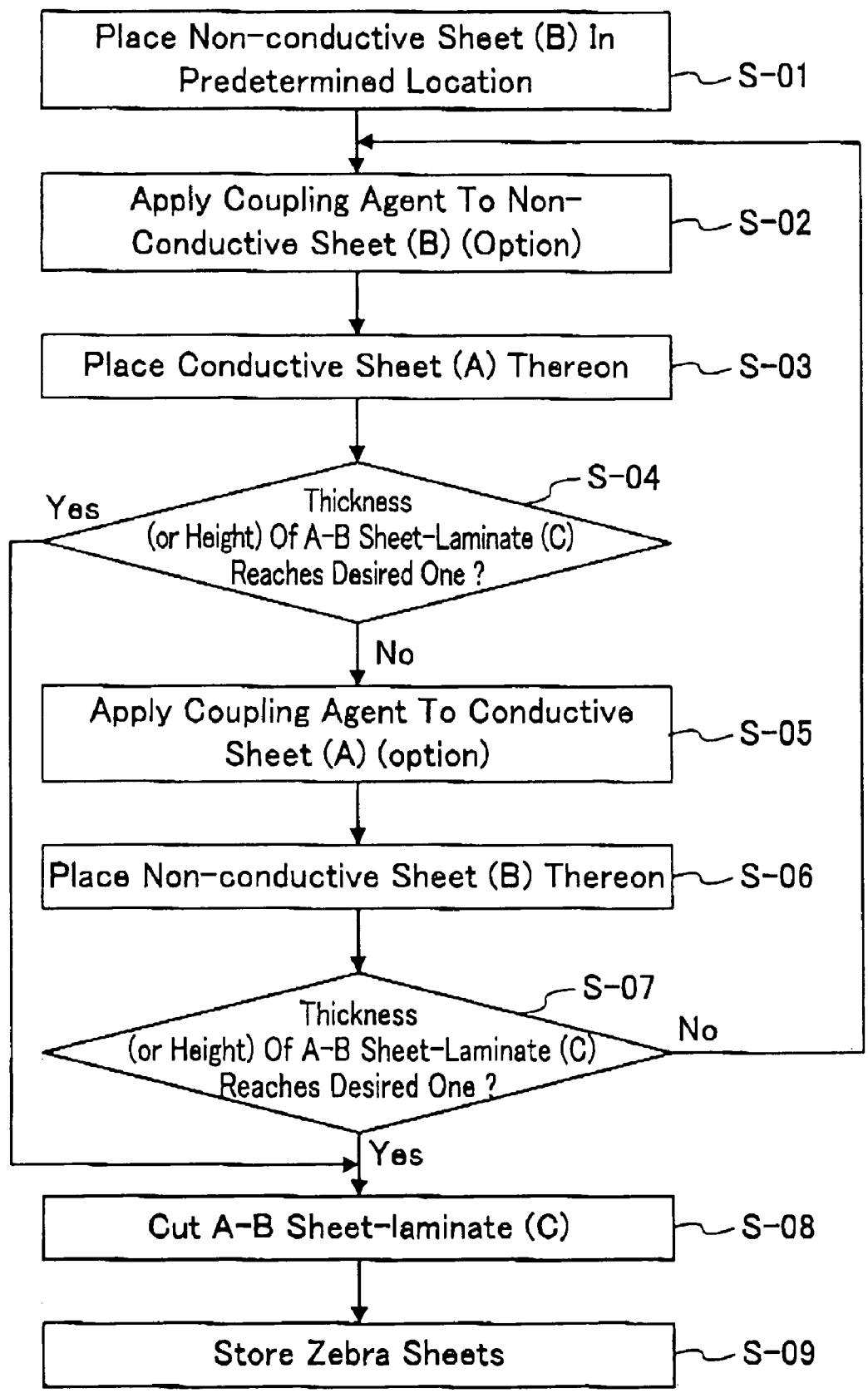
FIG. 7 is a flow chart showing steps of producing a laminate (C) and zebra sheet members in the method of manufacturing an anisotropic conductive sheet according to the embodiment of the present invention.
Figure 8:
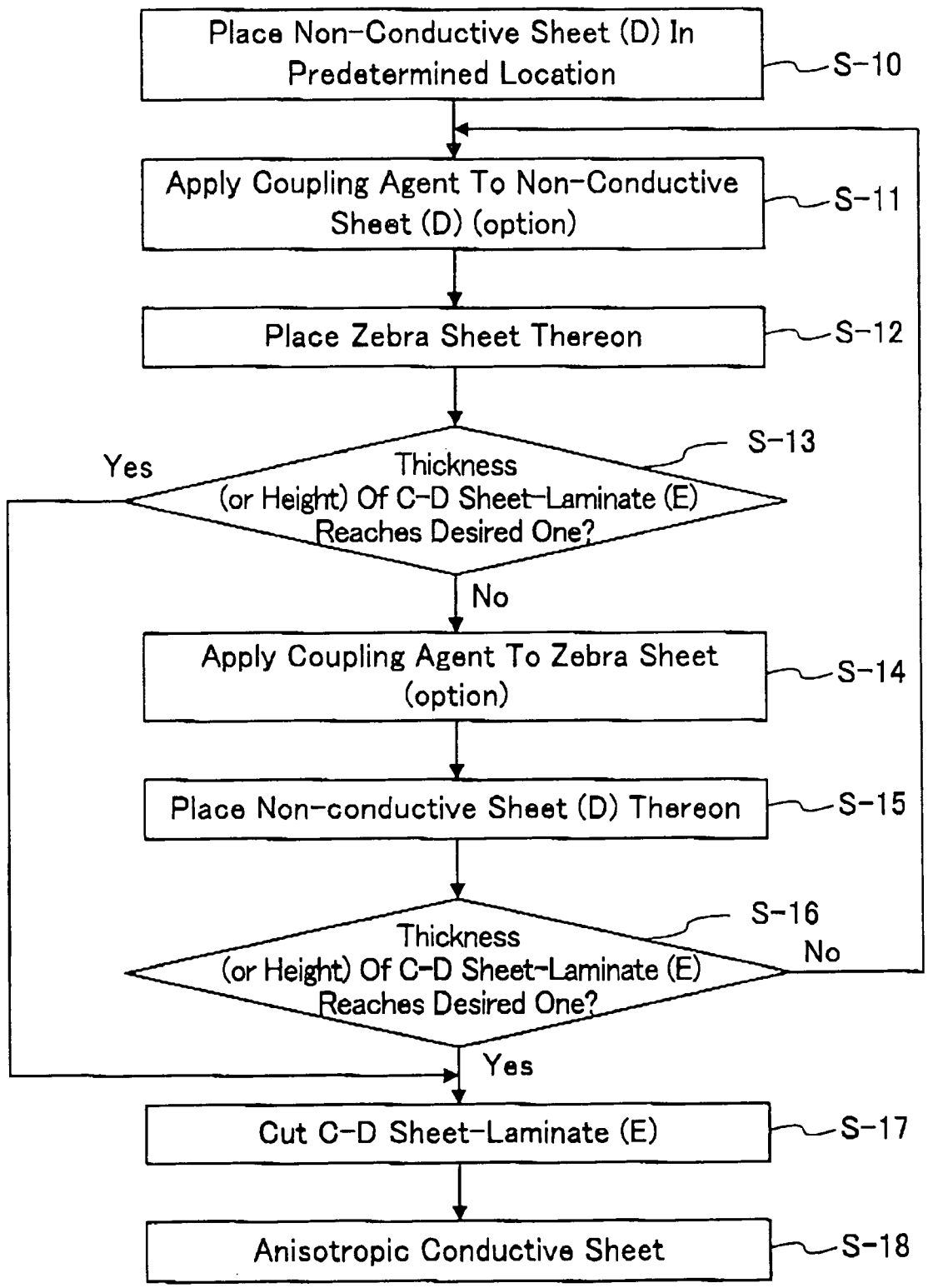
FIG. 8 is a flow chart showing step of producing an anisotropic conductive sheet with the zebra sheet members and other members in the method of manufacturing an anisotropic conductive sheet according to the embodiment of the present invention.

The flow chart of the method of manufacturing an anisotropic conductive sheet is presented in FIGS. 7 and 8. FIG. 7 shows a process of producing the zebra sheets. First, a non-conductive sheet is placed in a predetermined location for stacking (S-01). Optionally, a coupling agent is applied to the upper side of the non-conductive sheet (S-02). It is needless to say that this step can be omitted because it 18 an optional step. (Ditto for other optional steps to be described later.) A conductive sheet (A) is placed thereon (S-03). Whether the thickness (or height) of the resulting A-and-B-sheets-laminated structure (C) has reached a desired thickness (or height) is checked (S-04). If the desired (predetermined) thickness is achieved, go to the first cutting step (S-08). If the desired (predetermined) thickness is not achieved, the coupling agent is applied to the upper side of the conductive sheet (A) optionally (S-05). Then, another non-conductive sheet (B) is placed thereon (S-06). Whether the thickness (or height) of the resulting A-and-B-sheets-laminated structure (C) has reached the desired thickness (or height) is checked (S-07). If the desired (predetermined) thickness is achieved, go to the first cutting step (S-08). If the desired (predetermined) thickness is not achieved, return to the step S-02. Then, the coupling agent is applied to the upper side of the non-conductive sheet (B) optionally. In the first cutting step (S-08) one or more zebra sheets are cut out at a time, and then stored (S-09).

FIG. 8 shows the Zebra and D sheets' stacking step of producing anisotropic conductive sheets form the zebra sheets and non-conductive sheets (D). First, a non-conductive sheet (D) is placed in a predetermined location for stacking (S-10). Optionally, the coupling agent is applied to the upper side of the non-conductive sheet (D) (S-11). A zebra sheet is placed thereon (S-12). Whether the thickness (or height) of the resulting Zebra-and-D-sheets-laminated structure (E) has reached a desired thickness (or height) is checked (S-13). If the desired (predetermined) thickness is achieved, go to the second cutting step (S-17). If the desired (predetermined) thickness is not achieved, the coupling agent is applied to the upper side of the zebra sheet optionally (S-14). Then, another non-conductive sheet (D) is placed thereon (S-15). Whether the thickness (or height) of the resulting Zebra-and-D-sheets-laminated structure (E) has reached the desired thickness (or height) is checked (S-16). If the desired (predetermined) thickness is achieved, go to the second cutting step (S-17). If the desired (predetermined) thickness is not achieved, return to the step S-11. Then, the coupling agent is applied to the upper side of zebra sheet optionally. In the second cutting step (S-17) one or more anisotropic conductive sheets are cut out at a time, and then stored (S-18).

Figure 9:
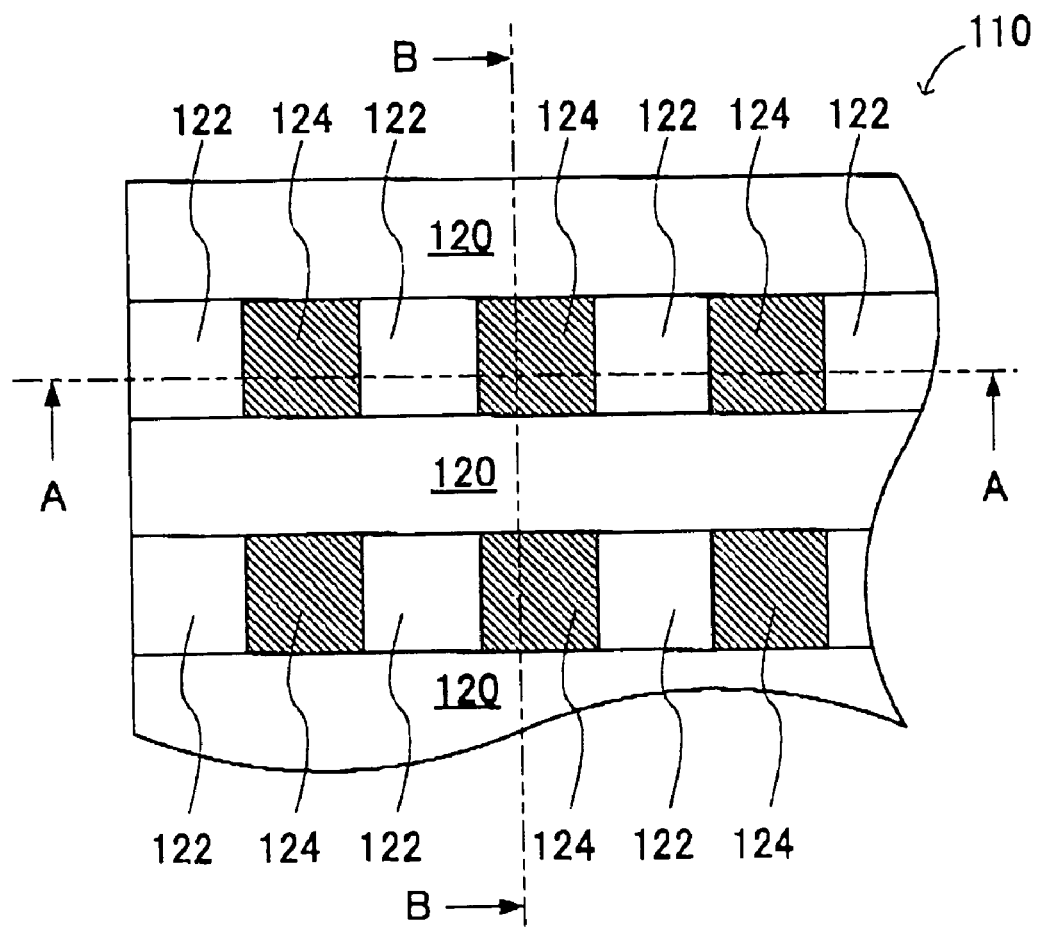
FIG. 9 is a partial plan view of an anisotropic conductive sheet according to another embodiment of the present invention.
Figure 10:
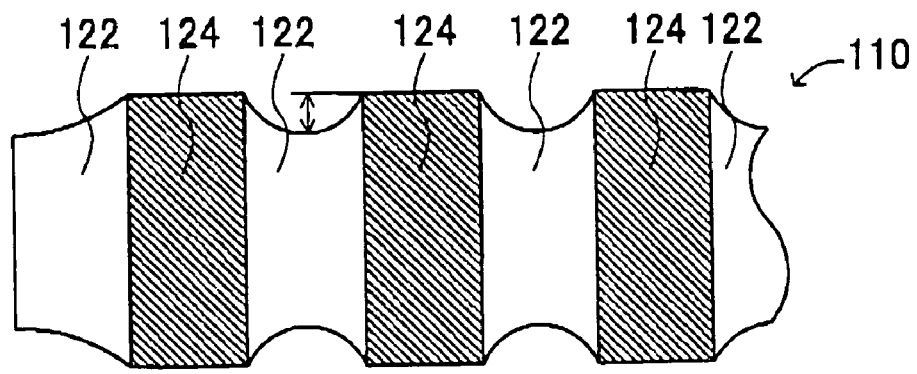
FIG. 10 is a partial sectional view of the anisotropic conductive sheet taken along the line A-A in FIG. 9.
Figure 11:
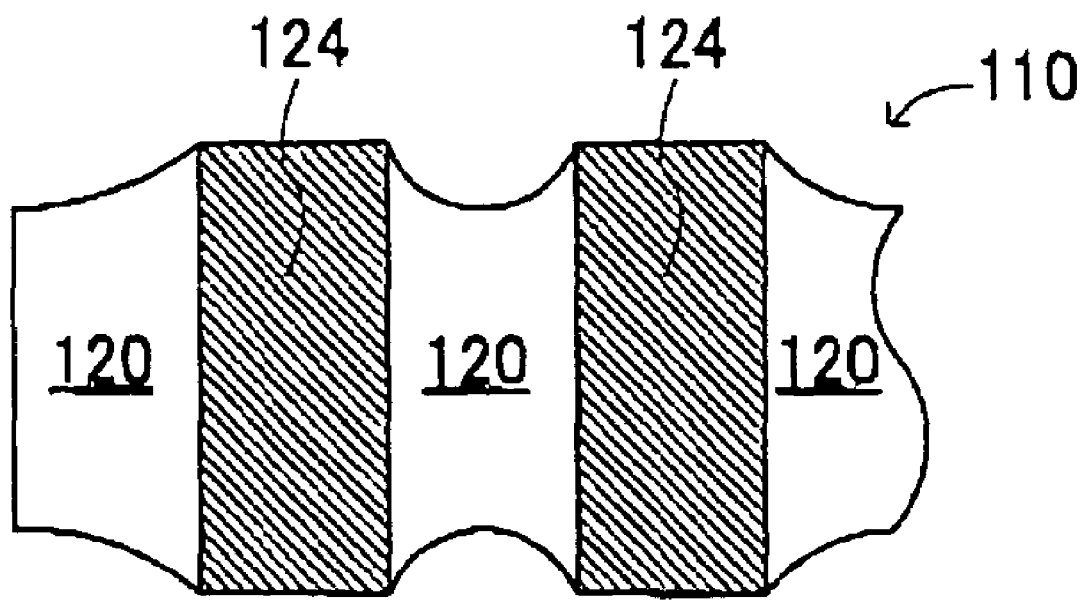
FIG. 11 is a partial sectional view of the anisotropic conductive sheet taken along the line B-B in FIG. 9.

FIGS. 9, 10, and 11 show the second embodiment. In the second embodiment, vulcanized conductive sheet members and unvulcanized non-conductive sheet members are used to produce an anisotropic conductive sheet 110 by a method as described above. FIGS. 10 and 11 show cross sections of the anisotropic conductive sheet 110 taken along the line A-A and the line B-B respectively. As seen from the drawings, the conductive members 124 are protruding in a surface of the sheet, protruding relative to the non-conductive members 120 and 122 and as such, the reliability for contacts is high. The reason why the sheet takes on such geometry is the unvulcanized rubber is contracted owing to heating. At this time, the conductive elastomer is vulcanized and the non-conductive elastomer is unvulcanized. An unvulcanized non-conductive elastomer can be glued to a vulcanized elastomer by heating or the like. Therefore, the optional application of the coupling agent is not always necessary in the manufacturing method described above and as such, it can be crossed off the steps.

Figure 12:
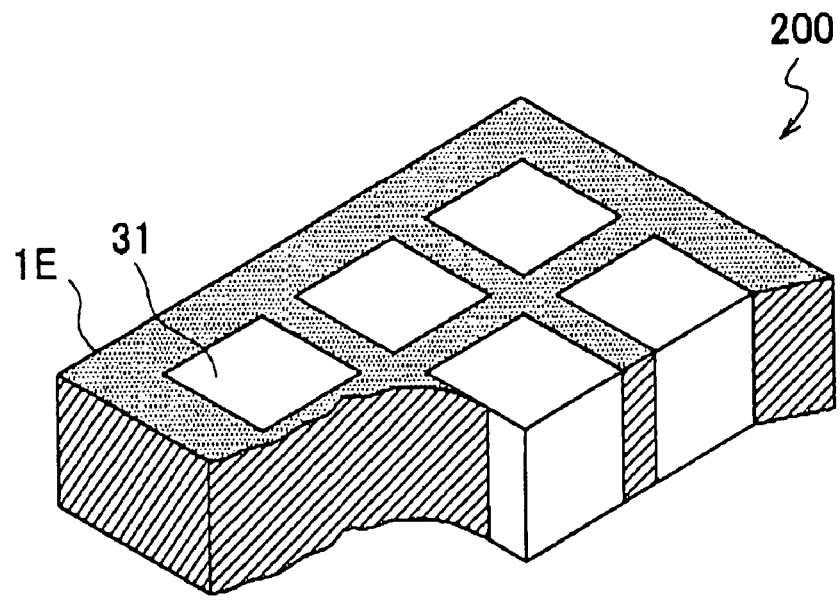
FIG. 12 is a partial perspective view of an anisotropic conductive sheet according to another embodiment of the present invention.
Figure 13:
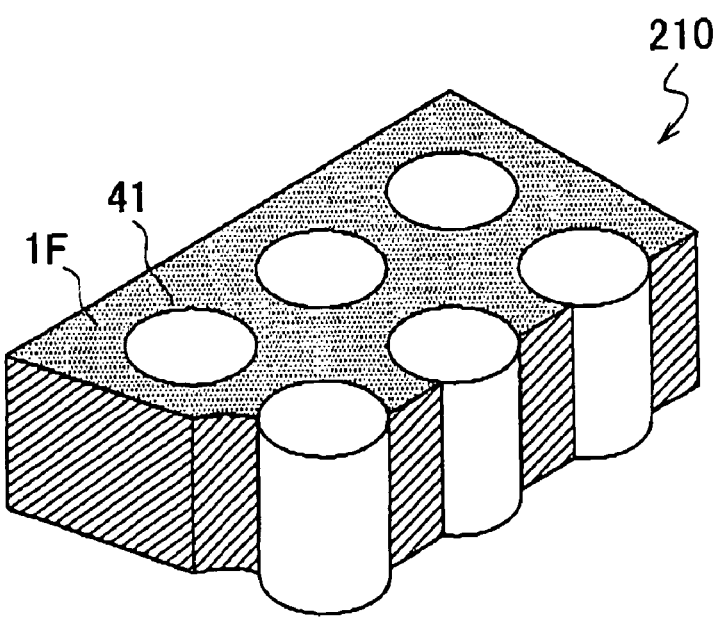
FIG. 13 is a partial perspective view of an anisotropic conductive sheet according to another embodiment of the present invention.
Figure 14:
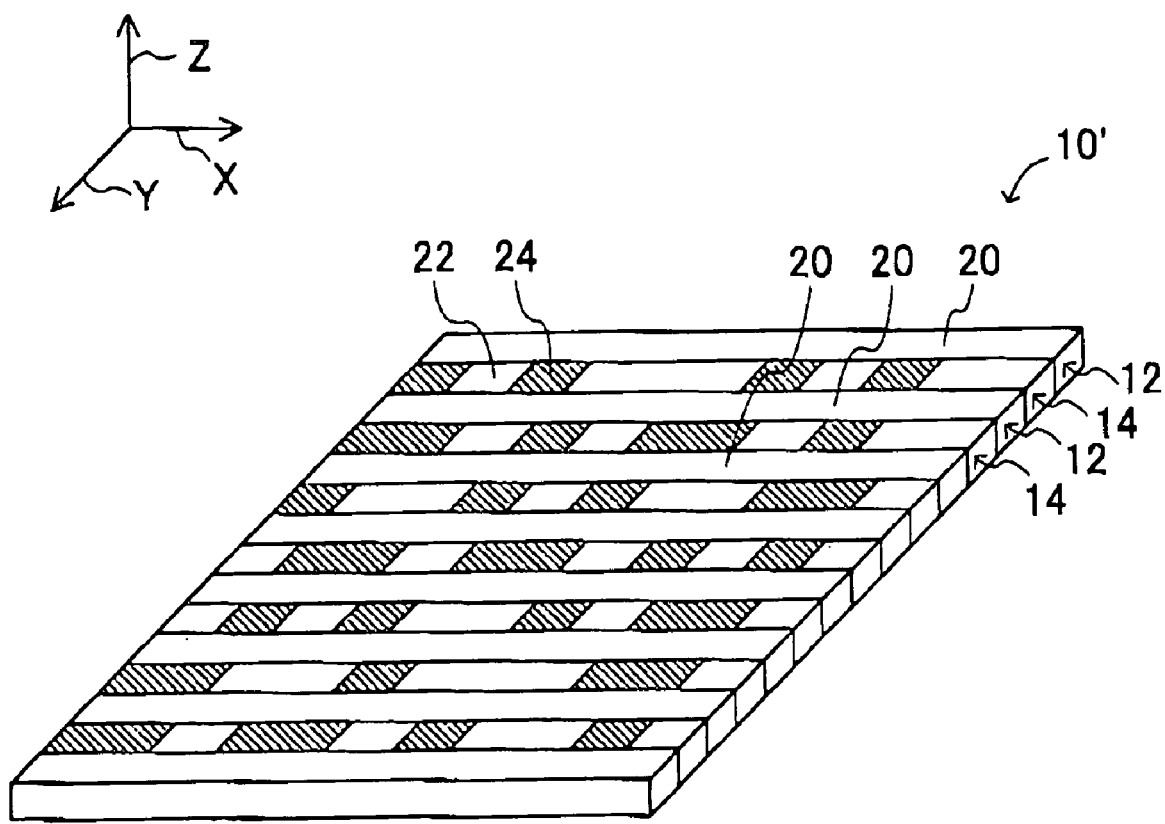
FIG. 14 is a partial perspective view of an anisotropic conductive sheet according to another embodiment of the present invention.

FIGS. 12 to 14 show other embodiments of the present invention. It is seen from FIG. 12 that conductive members 31 each composed of a conductive elastomer formed in a rectangular prism are surrounded by a matrix member 1E made from foamed resin and scattered in a plane of the anisotropic conductive sheet 200. While the volume percentage of the matrix member in this condition is lower in comparison with the above-mentioned embodiments, the conductive members are electrically isolated by the matrix member effectively. Incidentally, the conductive members penetrate the anisotropic conductive sheet 200 across the thickness of the sheet, from which it can be seen that the conductive property of the sheet is kept uniform. From FIG. 13, it is clear that conductive members 41 each composed of a cylindrical conductive elastomer are surrounded by a matrix member 1F made from a foamed resin and scattered in a plane of the anisotropic conductive sheet 210. The anisotropic conductive sheet 210 is nearly identical with the foregoing except that the form of the conductive members is changed from rectangular to circular one in section. FIG. 14 shows an anisotropic conductive sheet 10' different from the anisotropic conductive sheet 10 shown in FIG. 1 in that the conductive members 24 are disposed randomly. Other features of the sheet are the same as those of the anisotropic conductive sheet shown in FIG. 1.

Figure 15:
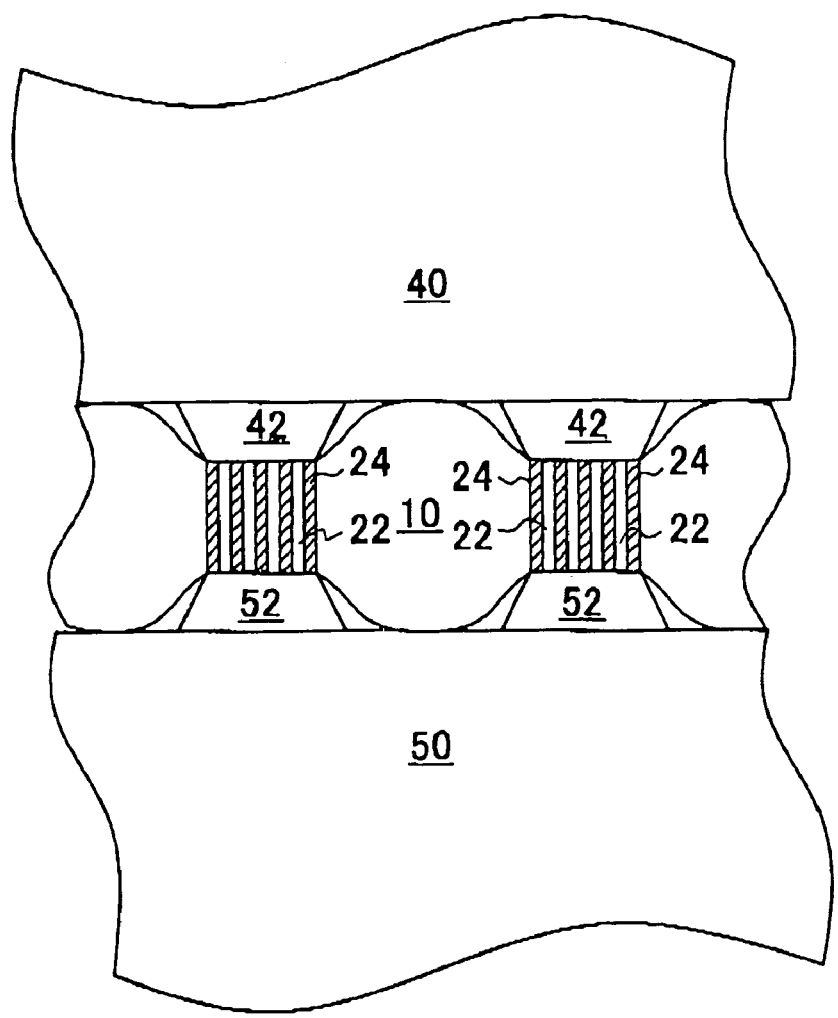
FIG. 15 is a schematic sectional view showing a condition where the anisotropic conductive sheet is sandwiched between terminals of boards.
Figure 16:
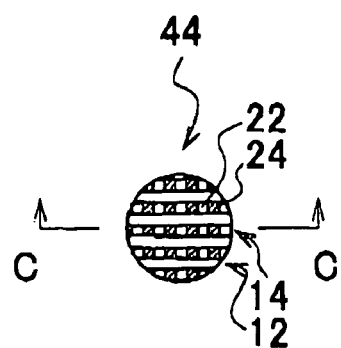
FIG. 16 is a view schematically showing a contact surface of the anisotropic conductive sheet in contact with one of the terminals when the sheet is sandwiched between terminals of the boards.

FIGS. 15 and 16 show an example of application of an anisotropic conductive sheet 10 according to one of the embodiments of the present invention, in which the sheet is sandwiched between two boards 40 and 50. FIG. 15 schematically shows, in section, a situation where the anisotropic conductive sheet 10 sandwiched between the two boards 40, 50 receives a compressive force and a compressive strain is caused therein, whereby the conductivity between the terminals 42 of the board 40 and the terminals 52 of the board 50 is ensured. Since the terminals 42, 52 slightly protrude from the surfaces of the boards 40 and 50, it is expected that the contact pressure of the anisotropic conductive sheet 10 at the terminal surfaces is larger than that at other places on the boards in the vicinities of the terminals. Also, it is seen that the conductive members 22 in the anisotropic conductive sheet 10 between the terminals 42 and 52 form conductive channels. Further, the interfaces between the conductive member 22 and non-conductive member 24 are bonded chemically and as such, the form of the anisotropic conductive sheet 10 can be kept against shearing forces at the interface caused by the surface nonuniformity, etc. and the form can be restored when the compressive load is removed. FIG. 16 schematically shows a contact surface of the anisotropic conductive sheet 10 which is in contact with the terminal 42. It is seen from the drawing that the conductive members 24 are surrounded by the non-conductive members 12, 22 and electrically connected with the terminal 42.

What is claimed is:

1. An anisotropic conductive sheet having a conductive property in a thickness direction thereof under a predetermined condition, comprising:

an insulative matrix member made of a first elastomer having a dielectric constant value of at the most 2.28 and/or a dielectric loss value of at the most 0.025; and a plurality of conductive members made of a second elastomer having a conductive property in said thickness direction under the predetermined condition, wherein said plurality of conductive members capable of conducting a flow of electricity between top and bottom surfaces thereof are located among said insulative matrix member in a scattered manner, said conductive and insulative matrix members are bonded chemically, and wherein said first elastomer and second elastomer are flush with each other at an interface therebetween, and the more apart from the interface, the smaller a thickness of said first elastomer becomes compared to said second elastomer.

2. The anisotropic conductive sheet according to claim 1, wherein said conductive members and said insulative matrix member are bonded together by a silane coupling agent.

3. A pair of printed wiring boards comprising the anisotropic conductive sheet of claim 2, wherein the anisotropic conductive sheet is sandwiched between the pair of printed wiring boards.

4. The anisotropic conductive sheet according to claim 1, wherein said insulative matrix member is each composed of a foamed resin member.

5. A pair of printed wiring boards comprising the anisotropic conductive sheet of claim 4, wherein the anisotropic conductive sheet is sandwiched between the pair of printed wiring boards.

6. The anisotropic conductive sheet according to claim 1, wherein the conductive members have a pitch of approximately 40 μm.

7. A pair of printed wiring boards comprising the anisotropic conductive sheet of claim 6, wherein the anisotropic conductive sheet is sandwiched between the pair of printed wiring boards.

8. A pair of printed wiring boards comprising the anisotropic conductive sheet of claim 1, wherein the anisotropic conductive sheet is sandwiched between the pair of printed wiring boards.

* * * * *